US00RE35829E

United States Patent [19]

Sanderford, Jr.

[11] E Patent Number: Re. 35,829

[45] Reissued Date of Patent: Jun. 23, 1998

[54] BINARY PHASE SHIFT KEYING MODULATION SYSTEM AND/OR FREQUENCY MULTIPLIER

[75] Inventor: Hugh Britton Sanderford, Jr., New Orleans, La.

[73] Assignee: Axonn Corporation, New Orleans, La.

[21] Appl. No.: 560,304

[22] Filed: Nov. 17, 1995

Related U.S. Patent Documents

Reissue of:

[64] Patent No.: 5,265,120
Issued: Nov. 23, 1993
Appl. No.: 850,692
Filed: Mar. 11, 1992

U.S. Applications:

[63] Continuation-in-part of Ser. No. 572,468, Aug. 27, 1990, Pat. No. 5,119,396.

[51] Int. Cl.[6] ..... H04L 9/00

[52] U.S. Cl. ..... 375/200; 375/283; 375/308; 375/329; 332/103

[58] Field of Search ..... 375/200, 201, 375/202, 203, 205, 283, 308, 329; 332/103

[56] References Cited

U.S. PATENT DOCUMENTS

| | | | |
|---|---|---|---|
| 3,479,616 | 11/1969 | Hazzard | 332/43 |
| 4,468,784 | 8/1984 | Jagnow et al. . | |
| 4,979,183 | 12/1990 | Cowart | 375/1 |
| 5,029,180 | 7/1991 | Cowart | 375/1 |
| 5,045,816 | 9/1991 | Bramhall et al. | 332/105 |
| 5,119,396 | 6/1992 | Sanderford, Jr. | 375/1 |

*Primary Examiner*—David C. Cain
*Attorney, Agent, or Firm*—Burns, Doane, Swecker & Mathis, LLP

[57] ABSTRACT

A low cost spread spectrum modulator for BPSK, or Binary Phase Shift Keying capable of outputting the high modulation rate and suppressed carrier output needed in spread spectrum systems. The present invention provides high quality BPSK modulation without the double balance mixers as required in the prior art, thereby dispensing with the necessity of complex transistor/potonciometer or diode/transformer arrangements. The present invention provides BPSK modulation utilizing only one transformer, which can be adjusted for carrier suppression and two transistors, FET's, or digital logic gates or the like, allowing the present system to be driven from low power CMOS logic levels, yet producing eight db of gain. The present invention may also be utilized as a frequency multiplier, with the utilization of the appropriately high frequency transistor, FET, digital logic gate, or the like.

51 Claims, 2 Drawing Sheets

BINARY PHASE SHIFT KEYING MODULATION SYSTEM AND/OR FREQUENCY MULTIPLIER

Matter enclosed in heavy brackets [ ] appears in the original patent but forms no part of this reissue specification; matter printed in italics indicates the additions made by reissue.

REFERENCE TO RELATED APPLICATION

The present application is a continuation-in-part of patent application Ser. No. 07/572,468 filed Aug. 27, 1990, now U.S. Pat. No. 5,119,396, issued Jun. 2, 1992.

BACKGROUND OF INVENTION

1. Field of Invention

The present invention relates to modulators, and more particularly to an improved spread spectrum BPSK, or Binary Phase Shift Keying, Modulation system designed for providing gain, low cost and suppressed carrier output, as well as compatibility with CMOS low power logic modulation drive circuitry. The present invention also teaches a Frequency Multiplier circuit, which is much less costly than traditional designs currently known.

The present system teaches a new, superior, and less costly BPSK modulator and/or frequency multiplier than that contemplated by the prior art, providing a less complicated system while outputting increased gain over prior art modulators.

2. Prior Art & General Background

Previous spread spectrum BPSK modulators required conventional balance mixers to produce carrier suppression. These conventional modulators utilized either 1) a complex transistor array in conjunction with a transformer tunable with a potonciometer or 2) two center tapped transformers and four diodes, which arrangement required a high level drive circuit to modulate it, typically +7 to +15 dBM.

Besides the greater expense, increased complexity thereby contributing the probability of failure, and incompatibility with low power −10 dB CMOS logic drive circuitry, the prior art modulators typically produced on the order of six dB of signal loss, resulting in considerably less satisfactory overall performance when compared to the present invention.

3. General, Summary Discussion of the Invention

A low cost spread spectrum modulator is an essential component of a commercially viable spread spectrum communications system. While a low cost, high performance modulator has not been contemplated until now, the present invention describes the ideal modulator, designed specifically for Binary Phase Shift Keying or BPSK.

The present invention is designed to provide a low cost, efficient, quality and reliable modulation system having sufficiently high BPSK modulation rate, coupled with the suppressed carrier output needed in spread spectrum communication systems and the like.

Unlike the prior art, which required balance mixers of the sort discussed in the background section supra, the present invention provides a BPSK modulator utilizing only one transformer having the capability of adjusting for maximum carrier suppression, in conjunction with two bipolar transistors, which allows the modulator to be driven from the low power logic levels found in CMOS circuitry −10 dBM. The present invention in its preferred embodiment produces eight dB of gain, much superior in performance over the prior art, which performs at a six dB signal loss.

Further, the preset invention is not limited to utilizing two bipolar transistors as discussed supra and may utilize in an equivalent fashion any device which provides sufficient gain at the desired frequency or operation, as well as having sufficiently fast switching capabilities.

For example, other acceptable, equivalent devices which may be utilized in place of the two transistors in the present invention may include high frequency field effect transistors (FET's), or digital logic gates, which are biased into a linear region utilizing common techniques. These devices may be incorporated into the system of the present invention, replacing in effect the transistors, utilizing common engineering techniques.

The present invention, in an alternative use, may be utilized as a frequency multiplier. For example, if the transistor, or its equivalent, is adequately fast, for example, $F_r > 1$ GHZ, the system may be utilized to create at its output a higher frequency harmonic.

As is known in the art, it is a common radio design practice to utilize a non-linear device such as a diode, transistor, or the like to perform frequency multiplication. This is desirable because only lower frequency crystals are readily available, and as such, the lower frequency must then be translated into the higher, desired frequency.

When the modulation transistor arrangement is additionally utilized in the present invention in the frequency modulation capacity, less subsequent stages are required. This serves to lower both the cost and complexity of a frequency multiplier system, when compared to the prior art systems.

It is thus an object of the present invention to provide a low cost, high quality BPSK modulator compatible for use in spread spectrum-type communications systems.

It is another object of the present invention to provide a BPSK modulation system which is compatible with low power logic input, such as that driven by CMOS circuitry.

It is still another object of the present invention to provide a BPSK modulator which utilizes a single transformer and two transistors, adjusts for carrier suppression, and provides eight db+ of gain.

BRIEF DESCRIPTION OF THE DRAWINGS

For a further understanding of the nature and objects of the present invention, reference should be had to the following detailed description, taken in conjunction with the accompanying drawings, in which like parts are given like reference numerals, and wherein.

DESCRIPTION OF THE PREFERRED EXEMPLARY EMBODIMENT(S)

The described modulator uses only one transformer which also adjusts for carrier suppression and two transistors, and as such can be driven from low power CMOS logic levels producing a full eight dB of gain.

Figure 1:
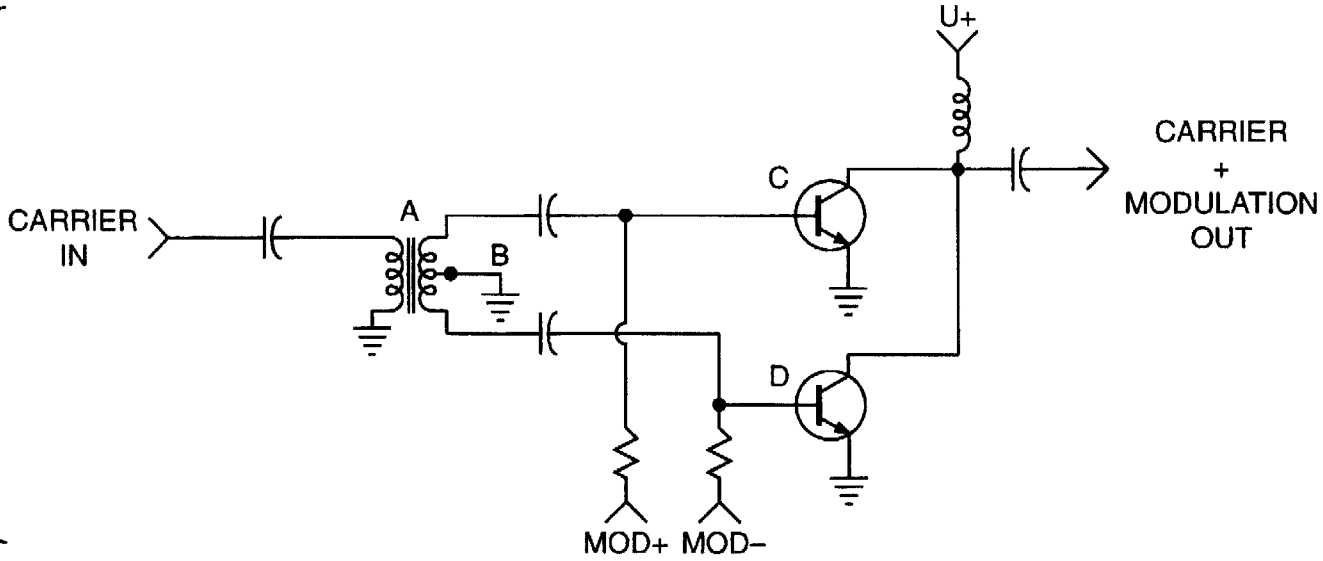
FIG. 1 is a Schematic Illustration of the preferred embodiment of the BPSK Modulator of the present invention.

BPSK modulation seeks to alternate a carrier between a 0 degree phase shift and a 180 degree phase shift, the phase shift of the carrier providing the modulation. As illustrated in FIG. 1 of the present invention, the outputs of the transformer "A", when the center tap "B" is grounded, are inherently at opposite phases, 0 degrees and 180 degrees.

Transistor C and D can then be alternately selected by biasing the MOD + or MOD − inputs to on. Thus, either the 0 degree phase shift or 180 degree phase shift can be selected, which provides BPSK modulation with 8 dB of gain.

An alternative embodiment to the present invention obviates with the need for the costly center tap in the transformer, further simplifying the present design. This circuit is based upon the premise that an inductor at resonance has outputs 180 degrees out of phase, producing 0 and 180 degrees outputs. The 0 degree and 180 degree outputs are selected using the same MOD −, MOD + biasing as described above.

Through extensive experimentation, the present inventor has determined that either tight (>0.6 coupling coefficient) or loose (<0.3 coupling coefficient) coupling of the transformer windings can be used to product suitable 0 degree and 180 degree phase shifts for BPSK modulation.

Figure 2:
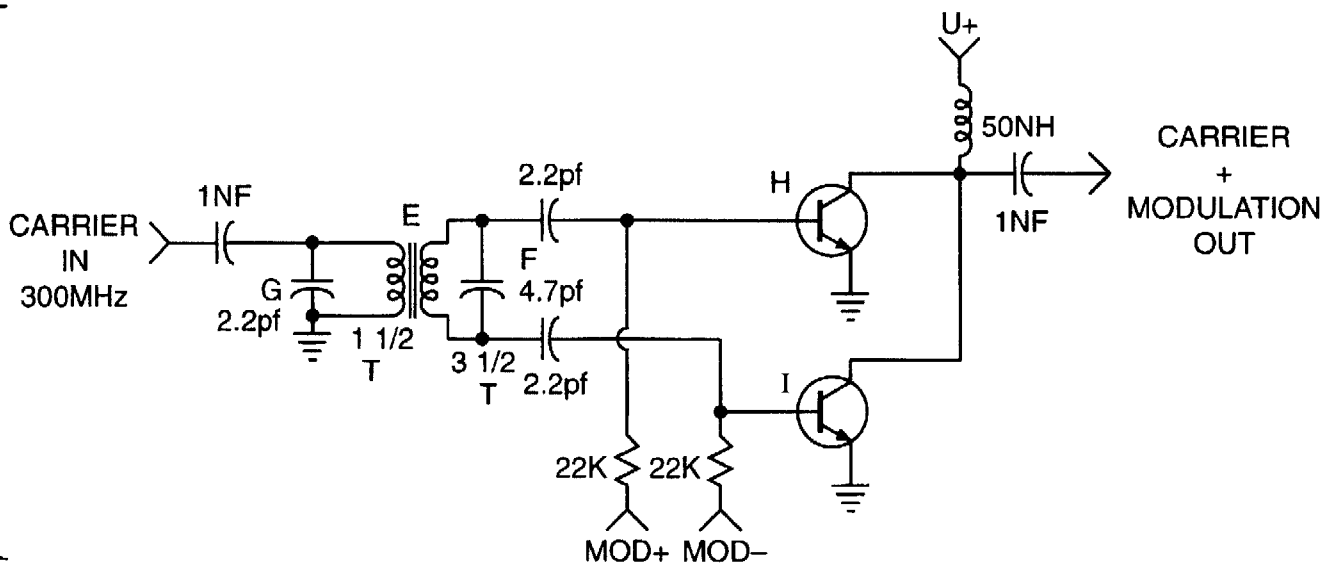
FIG. 2 is Schematic Illustration of an alternative, less costly embodiment of the BPSK Modulator of FIG. 1.

As illustrated in FIG. 2, in the embodiment implementing the loosely coupled transformer, both capacitors G and F must be configured to resonate in conjunction with the carrier frequency to be modulated. The resonate point in this circuit may be fine adjusted by varying the transformer's inductance, by turning the tunable core or slug of transformer E.

In a tightly coupled transformer, capacitor G can be eliminated and transformer E must be only resonate with capacitor F. Fine tuning is again achieved by adjusting the slug or core of transformer E. The value of capacitor F must be such that it resonates with transformer E at the frequency to be modulated.

Both embodiments of the invention perform identically when properly configured and can produce excellent BPSK spread spectrum modulation with adjustable carrier suppression.

As discussed above, the value of the resonate capacitors to be frequency. In the present invention, if a 1½ primary turn to 2 ½ secondary turn transformer is used with a carrier frequency of 300 MHz, then practical resonate capacitor values are 2.2 to 6.8 pf for G & E. The series coupling capacitors must be relatively small to minimize coupling of transistor base to collector capacitance. Practical values are from 2.2 to 8.2 pf.

The transformer turns ratio is selected to match the impedance of the driving carrier CKT to the input impedance of the gain/phase selection transistors.

Since FIG. 2 must be in resonance to function, the overall Q of the CKT and transformer coupling can be chosen to optimize performance as a tuned filter. Q is primarily effected by the transformer slug loss. Further loosely coupled transformers provide optimum filtering characteristics. This function can filter out undesirable harmonics from previous RF stages, eliminating otherwise required additional filter components.

The overall 8 dB of gain realized is a product of sums of both gain and losses of the entire circuit. The transformer produces 2 to 4 dB of loss, the coupling capacitors produce 1 dB of loss, the transistors provide 12 to 13 dB of gain. The average circuit gain is determined as the minimum overall gain (12−4−1)=7 dB to a maximum overall gain of (13−2−1)=10 dB of gain.

As discussed infra, the present invention's design is not limited to use in BPSK modulation. The present invention, in an alternative use, may be utilized as a frequency multiplier.

For example, if the transistor(s), or their equivalents, as utilized in the present invention, is adequately fast, for example. $F_r$>1 GHZ, the system may be utilized to create at its output a higher frequency harmonic. The circuit layout, and implementation of this alternative embodiment would remain substantively the same as set forth in the figures shown.

As is known in the art, it is a common radio design practice to utilize a non-linear device such as a diode, transistor, or the like to perform frequency multiplication. This is desirable because only lower frequency crystals are readily available, and as such, the lower frequency must then be translated into the higher, desired frequency.

When the modulation transistor arrangement is additionally utilized in the present invention in the frequency modulation capacity, less subsequent stages are required. This serves to lower both the cost and complexity of a frequency multiplier system, when compared to the prior art systems.

The embodiment(s) described herein in detail for exemplary purposes are of course subject to many different variations in structure, design, application and methodology. Because many varying and different embodiments may be made within the scope of the inventive concept(s) herein taught, and because many modifications may be made in the embodiment(s) herein detailed in accordance with the descriptive requirements of the law, it is to be understood that the details herein to be interpreted as illustrative and not in a limiting sense.

As a further example, other acceptable, equivalent devices may be utilized in place of the two transistors in the present invention. These may include high frequency field effect transistors (FET's), or digital logic gates, which are biased into a linear region utilizing common techniques. These devices may be incorporated into the system of the present invention, replacing in effect the transistors, utilizing common engineering techniques.

Figure 3:
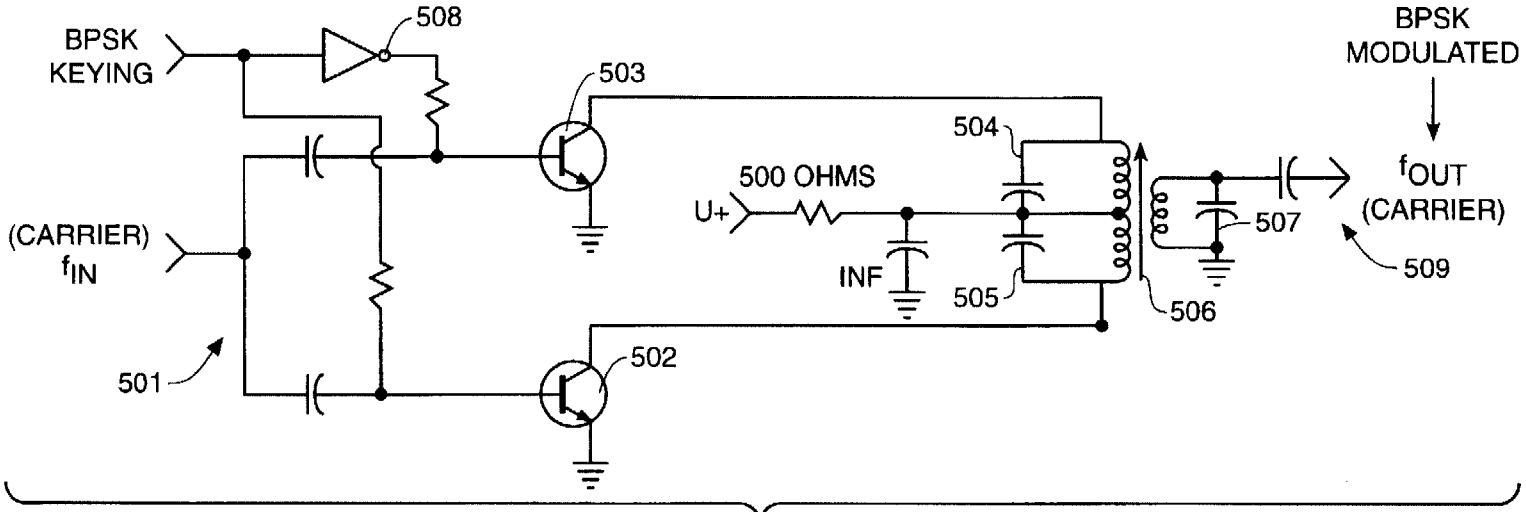
FIG. 3 is a Schematic Illustration of an alternative embodiment of the BPSK Modulator having transistors precede a phase shifting transformer.

For example, the topological dual of the described circuits is also practicable, having the gain or frequency multiplication precede the phase shifting transformer. In an alternate embodiment of the present invention, as shown in FIG. 3, a frequency $f_{IN}$ is introduced at 501, so that the frequency $f_{IN}$ is AC coupled and present on both transistors 502 and 503. BPSK data is generated in complement via inverter 508, thereby selecting, via base bias resistors, transistors 502 or 503. The collectors are connected via the opposite center tapped primary windings of transformer 506. The center tap provides DC power and AC bypass. The selection of transistor 502 or 503 thereby forces a 0° or 180° phase relationship on $f_{OUT}$ 509. Capacitors 504, 505, and 507 can be used to effect single or double pole filtering depending on the coupling of transformer 506. Frequency multiplication can also be achieved with transistors 502 and 503 by adjusting bias and drive levels for nonlinear output, as well as tuning transformer 506 to the target harmonic.

Figure 4:
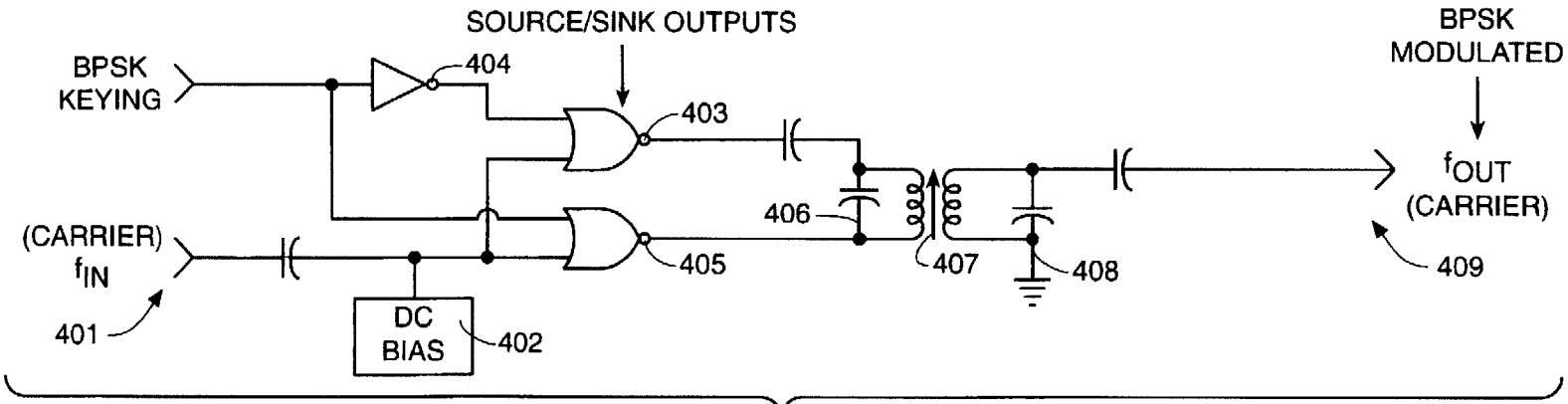
FIG. 4 is a Schematic Illustration of an alternative embodiment of the BPSK Modulator replacing transistors with very high speed logic gates.

An additional alternate embodiment of the present invention, illustrated in FIG. 4, has very high speed logic gates 403, 405 biased into a linear region and replacing transistors 502, 503 of FIG. 3. As shown in FIG. 4, a frequency is introduced via $f_{IN}$ in 401. Bias network means, embodied as a DC bias device 402, is used to force logic elements 403, 405 into a linear region of operation. Either AND gates or OR gates can be made to function in this circuit. The inverter 404 provides complementary BPSK data thereby selecting either gate 403 or gate 405. The outputs then drive the primary of a transformer 407 causing either a 0° or a 180° phase shift on the output of the transformer 407 at $f_{OUT}$ 409. In addition, the transformer 407 can be used as a one or two pole filter in conjunction with capacitors 406, 408, depending on the coupling coefficient of the transformer 407.

Furthermore, gates 403, 405 can be used as frequency multipliers by adjusting the DC offset and drive levels on the inputs of gates 403, 405, and tuning transformer 407 to the desired harmonic output.

What is claimed is:

1. A BPSK Modulator circuit, comprising:

a transformer, said transformer further comprising first induction means having a carrier input leg and an output leg, second induction means having first and second leg outputs, said transformer configured such that said first and second leg outputs of said second induction means modulates at opposite phases of 180 and 0 degrees, forming "MOD +" and "MOD −", respectively, relative a carrier signal supplied to said carrier input of said first induction means;

first and second phase selection means configured to modulate via input of said of said first and second outputs of said second induction means, said first and second phase selection means further comprising first and second load transistors or their equivalent, respectively, each having an emitter, and a base or the equivalent, said base of said first transistor in circuit with said first output of said second inductor, receiving said "MOD +", said base of said second transistor in circuit with said second output of said second inductor, receiving said "MOD −".

2. A BPSK Modulator circuit having a tunable slug or core to adjust carrier suppression in a spread spectrum system, comprising:

a transformer, said transformer further comprising first induction means having a carrier input leg and an output leg, second induction means having first and second leg outputs, and a tunable slug or core in communication with said first and second induction means, said transformer configured such that said first and second leg outputs of said second induction means modulates at opposite phases of 180 and 0 degrees, forming "MOD +" and "MOD −", respectively, relative a carrier signal supplied to said carrier input of said first induction means;

first and second phase selection means configured to modulate via input of said first and second leg outputs of said second induction means, said first and second phase selection means further comprising first and second load transistors, respectively, each having an emitter, a collector, and a base, said base of said first transistor in circuit with said first output leg of said second inductor, receiving said "MOD +", said base of said second transistor in circuit with said second output leg of said second inductor, receiving said "MOD −".

3. A BPSK Modulator circuit utilizing a loosely coupled transformer to adjust carrier suppression in a spread spectrum system, comprising:

a transformer, said transformer further comprising first induction means having a carrier input leg and an output leg, second induction means loosely coupled with said first induction means, said second induction means having first and second leg output, said transformer configured such that said first and second leg outputs of said second induction means modulates at opposite phases of 180 and 0 degrees, forming "MOD +" and "MOD −", respectively, relative a carrier signal supplied to said carrier input of said first induction means;

first and second capacitors, said first capacitor in parallel circuit with said carrier input leg and grounded output leg of said first induction means, said second capacitor in parallel circuit with said first and second leg outputs of said second induction means, first and second phase selection means configured to modulate via input of said first and second outputs of said second induction means, said first and second phase selection means further comprising first and second load transistors, respectively, each having an emitter, a collector, and a base, said base of said first transistor in serial circuit with said first leg output of said second inductor, receiving said "MOD +", said base of said second transistor in serial circuit with said second leg output of said second inductor, receiving said "MOD −".

4. The BPSK Modulation System of claim 3, wherein there is further included a tunable slug or core is in communication with said first and second inductors.

5. The BPSK Modulation System of claim 4, wherein there is further included resonator capacitor means in parallel circuit with said first and said second leg outputs of said second induction means, said resonator capacitor transformer coupling means configured to provide band pass filtering for previous stage harmonic suppression.

6. A BPSK Modulator circuit having a tightly coupled transformer having no center tap and a single parallel resonate capacitor on the secondary to provide BPSK modulation, comprising:

a transformer, said transformer further comprising first induction means having a carrier input leg and an output leg, second induction means tightly coupled to said first induction means, said second induction means having first and second leg outputs, said transformer configured such that said first and second leg outputs of said second induction means modulates at opposite phases of 180 and 0 degrees, forming "MOD +" and "MOD −", respectively, relative a carrier signal supplied to said carrier input of said first induction means;

band pass filter means for filtering harmonic suppression from said transformer, said band pass filter means further comprising a resonate capacitor in parallel circuit with said first and second leg outputs of said second induction means;

first and second phase selection means configured to modulate via input of said of said first and second outputs of said second induction means, said first and second phase selection means further comprising first and second load transistors, respectively, each having an emitter, a collector, and a base, said base of said first transistor in circuit with said first leg output of said second inductor, receiving said "MOD +", said base of said second transistor in circuit with said second output of said second inductor, receiving said "MOD −".

7. The BPSK Modulation System of claim 6, wherein said system further comprises adjustment means for adjusting carrier suppression, said adjustment means further comprising a tunable slug or core in communication with said first and second induction means.

8. The BPSK Modulation System of claim 6, wherein there is further included resonator capacitor means in parallel circuit with said first and said second leg outputs of said second induction means, said resonator capacitor means configured to provide band pass filtering for previous stage harmonic suppression.

[9. A frequency multiplier circuit, comprising:

a transformer, said transformer further comprising first induction means having a carrier input leg and an output leg, second induction means having first and second leg outputs, said transformer configured such that said first and second leg outputs of said second induction means modulates at opposite phases of 180 and 0 degrees, forming "MOD +" and "MOD −", respectively, relative a carrier signal supplied to said carrier input of said first induction means;

phase selection means configured to modulate via input of said of said first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output or said second inductor, receiving said "MOD −".]

[10. A frequency multiplier circuit, comprising:

a transformer, said transformer further comprising first induction means having a carrier input leg and an output leg, second induction means having first and second leg outputs, said transformer configured such that said first and second leg outputs of said second induction means modulates at opposite phases of 180 and 0 degrees, forming "MOD +" and "MOD −", respectively, relative a carrier signal supplied to said carrier input of said first induction means;

phase selection means configured to modulate via input of said of said first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output of said second inductor, receiving said "MOD −".]

11. A frequency multiplier circuit utilizing a loosely coupled transformer to adjust carrier suppression, comprising:

a transformer, said transformer further comprising first induction means having a carrier input leg and an output leg, second induction means loosely coupled with said first induction means, said second induction means having first and second leg output, said transformer configured such that said first and second leg outputs of said second induction means modulates at opposite phases of 180 and 0 degrees, forming "MOD +" and "MOD −", respectively, relative a carrier signal supplied to said carrier input of said first induction means;

first and second capacitors, said first capacitor in parallel circuit with said carrier input leg and grounded output leg of said first induction means, said second capacitor in parallel circuit with said first and second leg outputs of said second induction means, phase section means configured to modulate via input of said of said first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output of said second inductor, receiving said "MOD −".

12. The method of modulating a carrier between a 0 degree phase shift and a 180 degree phase shift, comprising the following steps:

a. providing a transformer, said transformer further comprising first induction means having a carrier input leg and an output leg, and second induction means having first and second leg outputs, and a tunable slug or core in communication with said first and second induction means;

b. tuning said slug or core such that said first and second leg outputs of said second induction means modulates at opposite phases of 180 and 0 degrees, forming "MOD +" and "MOD −", respectively, relative a carrier signal supplied to said carrier input of said first induction means;

c. providing first and second phase selection means configured to modulate via input of said first and second leg outputs of said second induction means, said first and second phase selection means further comprising first and second load transistors, respectively, each having an emitter, a collector, and a base;

d. configuring said base of said first transistor in circuit with said first output leg of said second inductor, receiving said "MOD +", said base of said second transistor in circuit with said second output leg of said second inductor, receiving said "MOD −".

13. The method of utilizing a loosely coupled transformer to adjust carrier suppression, modulating a carrier signal between a 0 degree phase shift and a 180 degree phase shift, comprising the following steps:

a. providing a transformer, said transformer further comprising an inductor having first induction means having a carrier input leg, an output leg, and windings, and second induction means having first and second leg outputs and windings;

b. coupling said windings of said first and second induction means to a >0.6 and <0.3 coupling coefficient;

c. modulating said inductor at opposite phases of 180 and 0 degrees, forming "MOD +" and "MOD −", respectively, relative a carrier signal supplied to said carrier input of said first induction means;

d. providing first and second phase selection means configured to modulate via input of said first and second leg outputs of said second induction means, said first and second phase selection means further comprising first and second load transistors, respectively, each having an emitter, a collector, and a base;

e. configuring said base of said first transistor in circuit with said first output leg of said second inductor, receiving said "MOD +", said base of said second transistor in circuit with said second output leg of said second inductor, receiving said "MOD −".

14. The method of claim 13, wherein there is included the further step of providing first and second capacitors, said first capacitor in parallel circuit with said carrier input leg and grounded output leg of said first induction means, said second capacitor in parallel circuit with said first and second leg outputs of said second induction means.

[15. The method of multiplying a carrier to provide a higher frequency harmonic, comprising the following steps:

a. providing a transformer, said transformer further comprising first induction means having a carrier input leg and an output leg, and second induction means having first and second leg outputs, and a tunable slug or core in communication with said first and second induction means;

b. tuning said slug or core such that said first and second leg outputs of said second induction means modulates at opposite phases of 180 and 0 degrees, forming "MOD +" and "MOD −", respectively, relative a carrier signal supplied to said carrier input of said first induction means;

c. providing phase selection means configured to modulate via input of said of said first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output of said second inductor, receiving said "MOD −", d. configuring said first base in circuit with said first output leg of said second inductor, receiving said "MOD +", and said second base in circuit with said second output leg of said second inductor, receiving said "MOD −", multiplying the carrier to provide a higher frequency harmonic.]

[16. The method of utilizing a loosely coupled transformer to adjust carrier suppression, modulating a carrier signal between a 0 degree phase shift and a 180 degree phase shift, and multiplying a carrier to provide a higher frequency harmonic, comprising the following steps:

a. providing a transformer, said transformer further comprising an inductor having first induction means having a carrier input leg, an output leg, and windings, and second induction means having first and second leg outputs and windings;

b. coupling said windings of said first and second induction means to a >0.6 and <0.3 coupling coefficient;

c. modulating said inductor at opposite phases of 180 and 0 degrees, forming "MOD +" and "MOD −", respectively, relative a carrier signal supplied to said carrier input of said first induction means;

d. providing phase selection means configured to modulate via input of said of said first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output of said second inductor, receiving said "MOD −".

e. configuring said first base in circuit with said first output leg of said second inductor, receiving said "MOD +", and said second base in circuit with said second output leg of said second inductor, receiving said "MOD −", multiplying the carrier to provide a higher frequency harmonic.]

17. The method of claim [16] *28*, wherein there is included the further step of providing first and second capacitors, said first capacitor in parallel circuit with said carrier input leg and grounded output leg of said first induction means, said second capacitor in parallel circuit with said first and second leg outputs of said second induction means.

18. A BPSK modulator comprising:

a center tapped transformer having first and second primary legs, said center tapped transformer having a secondary;

amplification means coupled to both first and second primary legs of said center tapped transformer;

selection means, coupled through said amplification means to said center tapped transformer, said selection means driven by a BPSK data input, for enabling one of the first and second primary legs of said center tapped transformer; and coupling means attached to said secondary of said center tapped transformer to yield BPSK carrier modulation.

19. The BPSK modulator as set forth in claim 18, wherein said center tapped transformer is turned to a resonance frequency by at least one capacitor, thereby providing low cost filtering.

20. The BPSK modulator as set forth in claim 18, wherein said amplification means provides frequency multiplication.

21. A BPSK modulator comprising:

a plurality of logic gates, each logic gate coupled to a primary leg of a transformer, to provide amplification;

selection means, responsive to a BPSK data input, to enable one of said plurality of logic gates; and coupling means to yield a BPSK modulating carrier signal on a secondary of the transformer.

22. The BPSK modulator as set forth in claim 21 wherein the transformer is tuned to a resonance frequency by a plurality of capacitors, thereby providing low cost filtering.

23. The BPSK modulator as set forth in claim 21 wherein each of said plurality of logic gates provides frequency multiplication.

24. A frequency multiplier circuit, comprising:

a transformer, said transformer further comprising first induction means having a carrier input leg and an output leg, second induction means having first and second leg outputs, said transformer configured such that said first and second leg outputs of said second induction means modulate at opposite phases of 180 degrees and 0 degrees, forming "MOD +" and "MOD −", respectively, relative to a carrier signal supplied to said carrier input of said first induction means; and phase selection means configured to modulate via input of said first and second outputs of said second induction means, said phase selection means having a $F_r$>1 GHz, and further comprising an emitter, and first and second bases or the equivalent, said first base in circuit with said first leg output of said second induction means, receiving said "MOD +", said second base in circuit with said second leg output of said second induction means, receiving said "MOD −".

[25. A frequency multiplier circuit, comprising:

a transformer, said transformer further comprising first induction means having a carrier input leg and an output leg, second induction means having first and second leg outputs, said transformer configured such that said first and second leg outputs of said second induction means modulate at opposite phases of 180 degrees and 0 degrees forming "MOD +" and "MOD −", respectively, relative to a carrier signal supplied to said carrier input of said first induction means; and phase selection means configured to modulate via input of said first and second outputs of said second induction means, said phase selection means having a $F_r$>1 GHz, and further comprising an emitter, and first and second bases or the equivalent, said first base in circuit with said first output of said second induction means, receiving said "MOD +", said second base in circuit with said second output of said second induction means, receiving said "MOD −".]

26. A frequency multiplier circuit utilizing a loosely coupled transformer to adjust, carrier suppression, comprising:

a transformer, said transformer further comprising first induction means having a carrier input leg and an output leg, second induction means loosely coupled with said first induction means, said second induction means having first and second leg outputs, said transformer configured such that said first and second leg outputs of said second induction means modulate at opposite phases of 180 degrees and 0 degrees forming "MOD −" and "MOD −", respectively, relative to a carrier signal supplied to said carrier input of said first induction means;

first and second capacitors, said first capacitor in parallel circuit with said first and second leg outputs of said second induction means; and phase selection means configured to modulate via input of said first and second outputs of said second induction means, said phase selection means having a $F_r$>1 GHz, and further comprising an emitter, and first and second bases or the equivalent, said first base in circuit with said first output of said second induction means, receiving said "MOD +", said second base in circuit with said second output of said second induction means, receiving said "MOD −".

27. The method of multiplying a carrier to provide a higher frequency harmonic, comprising the following steps:

a. providing a transformer, said transformer further comprising first induction means having a carrier input leg and an output leg, and second induction means having first and second leg outputs, and a tunable slug or core in communication with said first and second induction means;

b. tuning said slug or core such that said first and second leg outputs of said second induction means modulates at opposite phases of 180 and 0 degrees, forming "MOD +" and "MOD −", respectively, relative a carrier signal supplied to said carrier input of said first induction means;

c. providing phase selection means configured to modulate via input of said [of said] first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output of said second inductor, receiving said "MOD −"; and d. configuring said first base in circuit with said first output leg of said second inductor, receiving said "MOD +", and said second base in circuit with said second output leg of said second inductor, receiving said "MOD −", multiplying the carrier to provide a higher frequency harmonic.

28. The method of utilizing a loosely coupled transformer to adjust carrier suppression, modulating a carrier signal between a 0 degree phase shift and a 180 degree phase shift, and multiplying a carrier to provide a higher frequency harmonic, comprising the following steps:

a. providing a transformer, said transformer further comprising an inductor having first induction means having a carrier input leg, an output leg, and windings, and second induction means having first and second leg outputs and windings;

b. coupling said windings of said first and second induction means to a >0.6 and <0.3 coupling coefficient;

c. modulating said inductor at opposite phases of 180 degrees and 0 degrees, forming "MOD +" and "MOD −", respectively, relative to a carrier signal supplied to said carrier input of said first induction means;

d. providing phase selection means configured to modulate via input of said [of said] first and second outputs of said second induction means, said phase selection means having a $F_r$>1 GHZ, and further comprising an emitter, and first and second bases or the equivalent, said first base in circuit with said first output of said second inductor, receiving said "MOD +", said second base in circuit with said second output of said second inductor, receiving said "MOD −".

e. configuring said first base in circuit with said first output leg of said second inductor, receiving said "MOD +", and said second base in circuit with said second output leg of said second inductor, receiving said "MOD −", multiplying the carrier to provide a higher frequency harmonic.

29. A BPSK Modulator circuit having a fixed transformer and a variable tuning capacitor, the fixed transformer and variable tuning capacitor to adjust carrier suppression in a spread spectrum system, comprising:

a transformer, said transformer further comprising first induction means having a carrier input leg and an output leg, second induction means having first and second leg outputs, a fixed transformer, and a variable tuning capacitor, the fixed transformer in communication with said first and second induction means, said transformer configured such that said first and second leg outputs of said second induction means modulate at opposite phases of 180 degrees and 0 degrees, forming "MOD +" and "MOD −", respectively, relative to a carrier signal supplied to said carrier input of said first induction means; and first and second phase selection means configured to modulate via input of said first and second outputs of said second induction means, said first and second phase selection means further comprising first and second load transistors, respectively, each having an emitter, a collector, and a base, said base of said first transistor in circuit with said first output let of said, second induction means, receiving said "MOD +", said base of said second transistor in circuit with said second output of said second induction means, receiving said "MOD −".

30. The BPSK modulation System as set forth in claim 3, further including a fixed transformer and a variable tuning capacitor, said fixed transformer in communication with said first and second induction means.

31. The BPSK modulation system as set forth in claim 6, further comprising adjustment means for adjusting carrier suppression, said adjustment means including a fixed transformer and a variable tuning capacitor, said fixed transformer in communication with said first and second induction means.

32. The method of multiplying a carrier to provide a higher frequency harmonic, comprising the following steps:

a. providing a fixed transformer, said transformer further comprising first induction means having a carrier input leg and an output leg, and second induction means having first and second leg outputs, and a variable tuning capacitor, said fixed transformer in communication with said first and second induction means;

b. tuning fixed transformer and variable tuning capacitor such that said first and second leg outputs of said second induction means modulates at opposite phases of 180 degrees and 0 degrees, forming "MOD +" and "MOD −", respectively, relative a carrier signal supplied to said carrier input of said first induction means;

c. providing phase selection means configured to modulate via input of said of said first and second outputs of said second induction means, said phase selection means having a $F_r$>1 GHZ and further comprising an emitter, and first and second bases or the equivalent, said first base in circuit with said first output of said second induction means, receiving said "MOD +", said second base in circuit with said second output of said second induction means, receiving said "MOD −"; and d. configuring said first base in circuit with said first output leg of said second induction means, receiving said "MOD +", and said second base in circuit with said second output leg of said second induction means, receiving said "MOD −", multiplying the carrier to provide a higher frequency harmonic.

*33. A binary phase shift keying (BPSK) modulator comprising:*

*a transformer including a primary and a secondary, said primary having two legs for receiving a carrier signal via each of two logic gates, respectively and said secondary outputting a BPSK modulated carrier; and*

*selection means responsive to a BPSK input signal, for alternately enabling the two logic gates to pass said carrier signal via each of said two legs to said secondary.*

*34. A BPSK modulator according to claim 33, wherein the two logic gates are biased to operate in a linear region.*

*35. A BPSK modulator according to claim 33, wherein the two logic gates are transistors each of which is biased to operate in a non-linear region.*

*36. A BPSK modulator according to claim 33, wherein the two logic gates are selectively enabled to produce a harmonic of the carrier signal.*

*37. A BPSK modulator according to claim 36, wherein each of the two logic gates is biased to produce a predetermined harmonic of said carrier.*

*38. A BPSK modulator according to claim 33, wherein the transformer further comprises:*

*means for tuning the transformer to select a predetermined output carrier frequency, including at least one of a capacitor in parallel with the primary and a capacitor in parallel with said secondary.*

*39. A BPSK modulator according to claim 36, wherein each of said two logic gates provides amplification of said carrier signal.*

*40. A BPSK modulator according to claim 33, wherein the transformer is loosely coupled and tuned to produce a predetermined output carrier frequency.*

*41. A BPSK modulator according to claim 33, further comprising amplification means for providing amplification of the enabled gate logic carrier signal.*

*42. A BPSK modulator according to claim 33, wherein the selection means is enabled to source or sink current.*

*43. A BPSK modulator according to claim 33, wherein the primary further includes a center tap.*

*44. A BPSK modulator according to claim 33, wherein a first leg and a second leg of said two legs are 180° out of phase with one another.*

*45. A method for modulating a carrier frequency signal by using a transformer to produce a zero degree phase shift and a 180 degree phase shift of the carrier frequency signal, said method comprising the steps of:*

*selectively enabling a zero degree input leg of the transformer in response to a first binary phase shift keying (BPSK) signal;*

*selectively enabling a 180 degree input leg of the transformer in response to a second BPSK signal; and*

*supplying a carrier signal to the transformer via said zero degree input leg and said 180 degree input leg, wherein the zero degree input leg and the 180 degree input leg are alternately selected by said first and second BPSK signals to produce BPSK modulation of said carrier frequency signal at an output of the transformer.*

*46. The method according to claim 45, wherein the steps of selectively enabling each include a step of:*

*biasing a selection means into a linear region of operation.*

*47. The method according to claim 45, wherein each of the steps of selectively enabling each produce a harmonic of the carrier frequency signal.*

*48. The method according to claim 47, wherein the steps of selectively enabling each include a step of:*

*biasing a selection means to produce a predetermined harmonic.*

*49. The method according to claim 45, further comprising the step of:*

*tuning the transformer to a predetermined output carrier frequency.*

*50. The method according to claim 49, wherein said step of tuning is performed using at least one of a capacitor on a primary of the transformer and a capacitor on a secondary of the transformer.*

*51. The method according to claim 45, further comprising the step of:*

*amplifying the carrier frequency signal within each of said zero degree input leg and said 180 degree input leg.*

*52. The method according to claim 45, further comprising the step of:*

*loosely coupling and tuning the transformer to a predetermined output carrier frequency.*

*53. The method according to claim 45, further comprising the step of:*

*amplifying the selectively enabled carrier signal.*

*54. The method according to claim 45, wherein the selection means is enabled to source or sink current.*

*55. The method according to claim 45, wherein the zero degree input leg and the 180° input leg are included in a primary of the transformer, said primary having a center tap leg.*

*56. The method, according to claim 45, wherein the steps of selectively enabling each include a step of:*

*biasing a selection means into a non-linear region of operation.*

* * * * *